(12) United States Patent
Chiu

(10) Patent No.: US 7,973,576 B2
(45) Date of Patent: Jul. 5, 2011

(54) VOLTAGE CONTROLLED OSCILLATORS AND PHASE-FREQUENCY LOCKED LOOP CIRCUIT USING THE SAME

(75) Inventor: Pao-Cheng Chiu, Taipei County (TW)

(73) Assignee: Mediatek Inc., Hsin-Chu (TW)

( * ) Notice: Subject to any disclaimer, the term of this patent is extended or adjusted under 35 U.S.C. 154(b) by 0 days.

(21) Appl. No.: 12/124,201

(22) Filed: May 21, 2008

(65) Prior Publication Data
US 2009/0289673 A1   Nov. 26, 2009

(51) Int. Cl.
H03L 7/06 (2006.01)

(52) U.S. Cl. ............... 327/156; 327/157; 331/2; 331/16; 331/25; 331/34; 375/373

(58) Field of Classification Search .......... 327/156–159; 331/2, 6, 7, 9, 16, 18, 25, 34, 57–61; 375/18, 375/19, 25, 34, 57, 373–376
See application file for complete search history.

(56) References Cited

U.S. PATENT DOCUMENTS

| 5,559,476 | A  | * | 9/1996 | Zhang et al. | 331/57 |
| 6,271,732 | B1 | * | 8/2001 | Herzel | 331/57 |
| 7,184,512 | B2 | * | 2/2007 | Takeshita et al. | 375/375 |
| 2006/0232344 | A1 | * | 10/2006 | Badets et al. | 331/16 |
| 2008/0031371 | A1 | * | 2/2008 | Liang et al. | 375/260 |
| 2008/0101521 | A1 | * | 5/2008 | Lee et al. | 375/371 |

OTHER PUBLICATIONS

"Design of Analog CMOS Integrated Circuits."-author: Behzad. Razavi, 1st and 2nd paragraph of p. 535, section 15.1, chapter 15; 1st paragraph below fig. 15.33 of p. 559, section 15.2, chapter 15; fig. 15.35.

* cited by examiner

*Primary Examiner* — Lincoln Donovan
*Assistant Examiner* — Shikha Goyal
(74) *Attorney, Agent, or Firm* — Thomas | Kayden

(57) ABSTRACT

A voltage controlled oscillator comprising first and second differential delay cells. The first differential delay cell has a first control voltage input terminal. The second differential delay cell is coupled to the first differential delay cell in a loop and has a second control voltage input terminal. The second voltage input terminal is disconnected from the first voltage control input terminal. The first voltage control input terminal receives a first voltage signal, and the second voltage control input terminal receives a second voltage signal different from the first voltage signal.

14 Claims, 10 Drawing Sheets

VOLTAGE CONTROLLED OSCILLATORS AND PHASE-FREQUENCY LOCKED LOOP CIRCUIT USING THE SAME

BACKGROUND OF THE INVENTION

1. Field of the Invention

The invention relates to a voltage controlled oscillator, and more particularly to a voltage controlled oscillator and voltage controlled oscillator applied in a phase-frequency locked loop circuit.

2. Description of the Related Art

A conventional voltage control ring oscillator is formed by n-stages delay cells coupled serially in a ring loop. All the delay cells are controlled by the same adjustable control voltage through their voltage control input terminals, and the oscillation frequency of the voltage controlled ring oscillator is thus obtained. FIG. 1 shows a voltage-to-frequency transfer curve of a conventional voltage control ring oscillator. The slope of the voltage-to-frequency transfer curve is calculated to serve as the gain of the voltage control ring oscillator, as the equation E1:

$$Kvco = dF/dVC \qquad (E1)$$

wherein Kvco represents the gain of the voltage control ring oscillator, dVC represents a control voltage difference, and dF represents a frequency difference corresponding to the control voltage difference.

When a voltage control ring oscillator is applied in a phase locked loop (PLL) circuit, a smaller Kvco is better for weak phase jitter. Thus, a voltage control ring oscillator with smaller Kvco is desired for a phase locked loop circuit.

With greater requirements from high-speed electronic devices, the center frequency (Fc) of a voltage control ring oscillator is increased by decreasing the number (n) of the stages of delay cells, decreasing node capacitance (Cp) of the voltage control ring oscillator, or increasing current (Iss) of each delay cell. FIG. 2 shows transfer curves of a 4-stage voltage control ring oscillator in different conditions. Referring to FIG. 2, from curve A to curve C, as the arrow 10 indicates, the center frequency (Fc) increases when n is decreased, Cp is decreased, and Iss is increased. However, the consumption current is increased, and Kvco also increases, undesirably. As shown In FIG. 2, curve A with the lowest center frequency Fc_L has the smallest Kvco, curve C with the highest center frequency Fc_H has the highest Kvco, and curve B with the medium enter frequency Fc_M has a medium Kvco.

Thus, for high-speed devices, a voltage control ring oscillator with a high center frequency and a small gain (Kvco) is desirable.

BRIEF SUMMARY OF THE INVENTION

An exemplary embodiment of a voltage controlled oscillator comprises first and second differential delay cells. The first differential delay cell has a first control voltage input terminal. The second differential delay cell is coupled to the first differential delay cell in a loop and has a second control voltage input terminal. The second voltage input terminal is disconnected from the first voltage control input terminal. The first voltage control input terminal receives a first voltage signal, and the second voltage control input terminal receives a second voltage signal different from the first voltage signal.

Another exemplary embodiment of a voltage controlled oscillator comprises first and second differential delay cells. The first differential delay cell has a first control voltage input terminal. The second differential delay cell is coupled to the first differential delay cell in a loop and has a second control voltage input terminal. The second control voltage input terminal is disconnected from the first voltage control input terminal. The first voltage control input terminal receives a first voltage signal with an adjustable level, and the second voltage control input terminal receives a second voltage signal with a fixed level.

Another exemplary embodiment of a voltage controlled oscillator comprises first and second differential delay cells. The first differential delay cell has a control voltage input terminal. The second differential delay cell is coupled to the first differential delay cell in a loop. The control voltage input terminal receives a voltage signal with an adjustable level; the delay time of the second differential delay cell is fixed.

An exemplary embodiment of a phase-frequency locked loop circuit comprises a voltage controlled oscillator, a frequency locked circuit, and a phase locked circuit. The voltage controlled oscillator is controlled by a first voltage signal and a second voltage signal and generates an output clock at an output terminal according to the first and second voltage signals. The frequency locked circuit receives a reference clock and the output clock and adjusts the first voltage signal according to the reference clock and the output clock. The phase locked circuit receives a data input signal and the output clock and adjusts the second voltage signal according to the data input signal and the output clock.

Another exemplary embodiment of a phase-frequency locked loop circuit comprises, a phase-frequency detector, a charge pump, a voltage controlled oscillator, and a frequency divider. The phase-frequency detector receives a reference clock and a feedback clock and generates an indication signal according to the difference between the reference clock and the feedback clock. The charge pump receives the indication signal, generates a first voltage signal, and adjusts a level of the first voltage signal according to the indication signal. The voltage controlled oscillator is controlled by the first voltage signal and generates an output clock at an output terminal. The frequency divider divides the frequency of the output clock to serve as the feedback for the phase-frequency detector. The voltage controlled oscillator comprises first and second differential delay cells. The first differential delay cell has a first control voltage input terminal for receiving the first voltage signal. The delay time of the first differential delay cell is determined by the adjusted level of the first voltage signal. The second differential delay cell is coupled to the first differential delay cell in a loop, and the delay time of the second differential delay cell is fixed.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figures 1, 2:
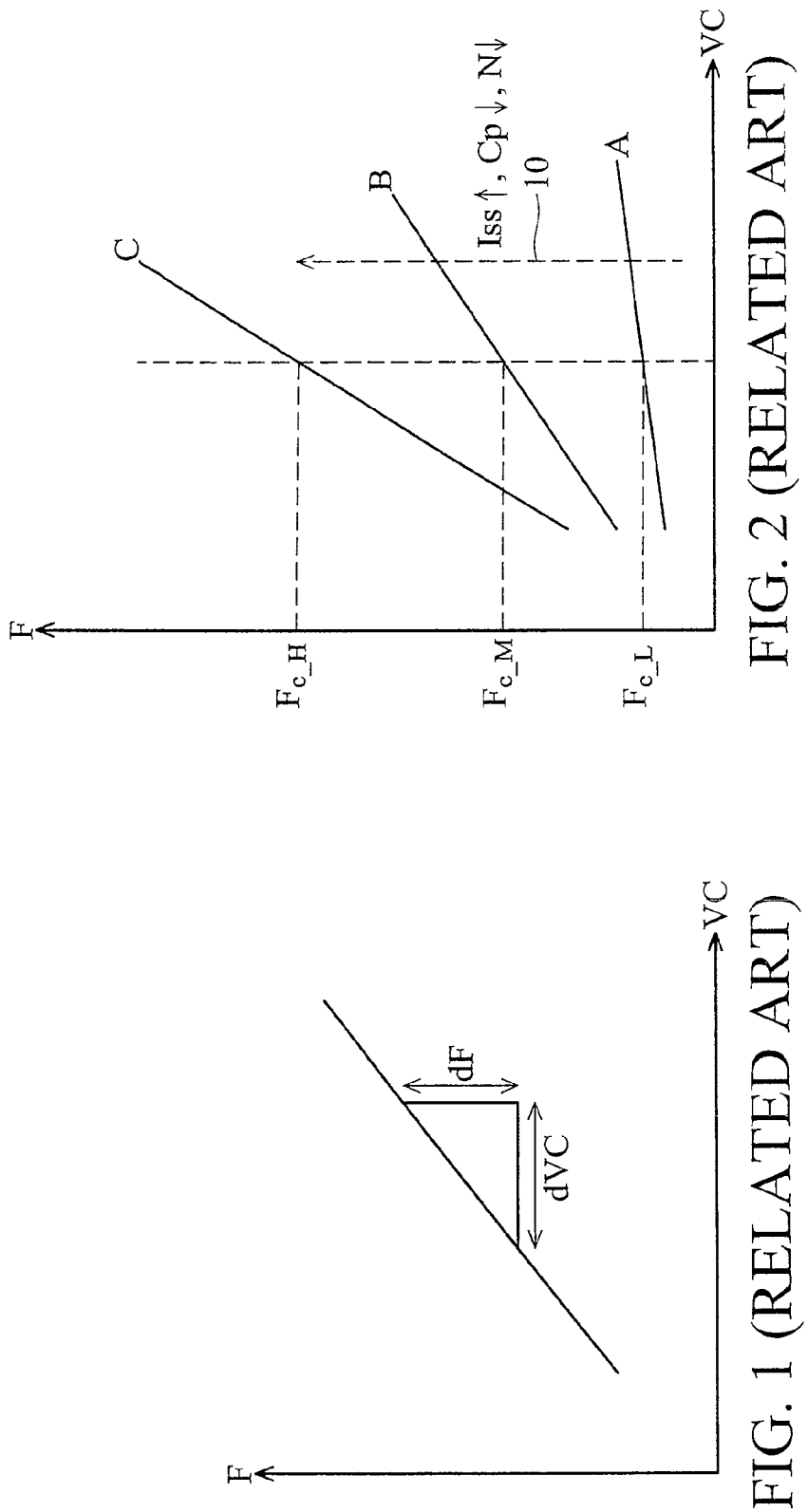
FIG. 1 shows a voltage-to-frequency transfer curve of a conventional voltage control ring oscillator.
FIG. 2 shows voltage-to-frequency transfer curves of a conventional voltage control ring oscillator with different number (n) of delay cell stages, capacitance (Cp) of the voltage control ring oscillator, and current (Iss) of each delay cell.
Figure 3:
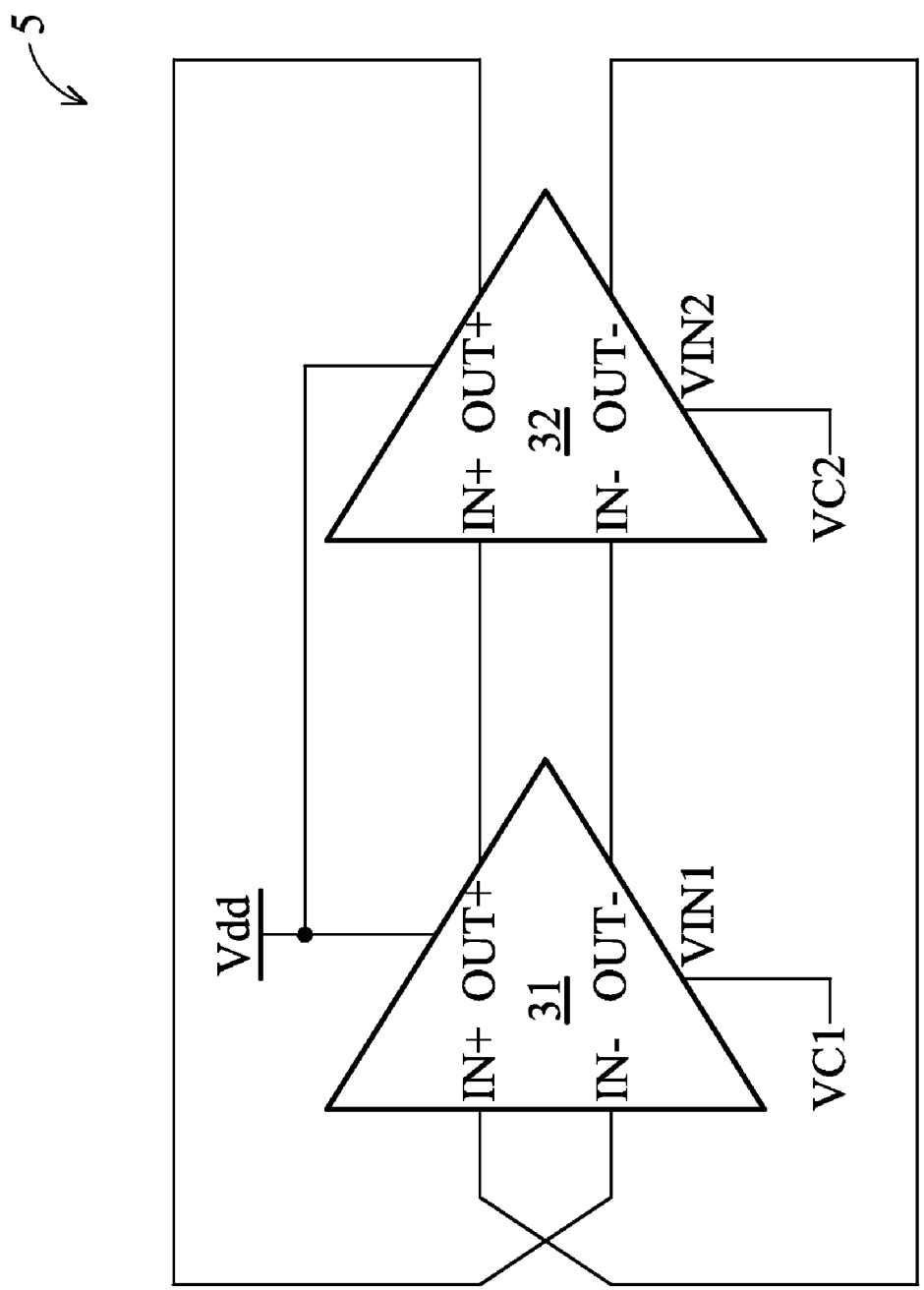
FIG. 3 shows an exemplary embodiment of a voltage controlled oscillator.

Voltage controlled oscillators are provided. In an exemplary embodiment of a voltage controlled oscillator in FIG. 3, a voltage controlled oscillator comprises n differential delay cells, that is the voltage controlled oscillator is an n-stage voltage controlled oscillator, wherein n≧2. In the embodiment of FIG. 3, a 2-stage voltage controlled oscillator 3 is given as an example and comprises differential delay cells 31 and 32. The differential delay cells 31 and 32 are serially coupled in a loop. In FIG. 3, one ring connection of the differential delay cells 31 and 32 is given as an example. Referring to FIG. 3, positive and negative output terminals (OUT+ and OUT−) of the differential delay cell 31 are respectively coupled to positive and negative input terminals (IN+ and IN−) of the differential delay cell 32. Positive and negative output terminals (OUT+ and OUT−) of the differential delay cell 32 are respectively coupled to negative and positive input terminals (IN− and IN+) of the differential delay cell 31. The differential delay cell 31 has a control voltage input terminal VIN1, and the differential delay cell 32 has a control voltage input terminal VIN2. The control voltage input terminals VIN1 and VIN2 are disconnected. The differential delay cell 31 is controlled by a voltage signal VC1 received through the control voltage input terminal VIN1, and the differential delay cell 32 is controlled by a voltage signal VC2 received through the control voltage input terminal VIN2. The voltage signal VC2 is different from the voltage VC2, in other words, the control voltage input terminals VIN1 and VIN2 are separate.

In some embodiments, each of the voltage signals VC1 and VC2 has an adjustable level, so that the delay time of the differential delay cells 31 and 32 are adjustable.

In other some embodiments, the voltage signal VC1 is at an adjustable level, and the voltage signal VC2 is at a fixed level, so that the delay time of the differential delay cell 31 is adjustable, and that of the differential delay cell 32 is fixed.

In the embodiment of FIG. 3, when the delay time of the differential delay cell 32 is fixed, the differential delay cell 32 receives the voltage signal VC2 with a fixed level through the control voltage input terminal VIN2. In some embodiments, the differential delay cell 32 has no control voltage input terminal to receive a voltage signal with a fixed level, so that the differential delay cell 32 is not controlled by a voltage signal, and the delay time of the differential delay cell 32 is fixed. As show in FIG. 4, a voltage controlled oscillator 4 comprises differential delay cells 41 and 42 of different types. The differential delay cells 41 and 42 are serially coupled in a loop. The differential delay cell 41 has a control voltage input terminal VIN1 which receives a voltage signal with an adjustable level, while the differential delay cell 42 does not have a control voltage input terminal. In other words, the differential delay cell 42 is not controlled by any voltage signal, and the delay time of the differential delay cell 42 is fixed.

Figure 5:
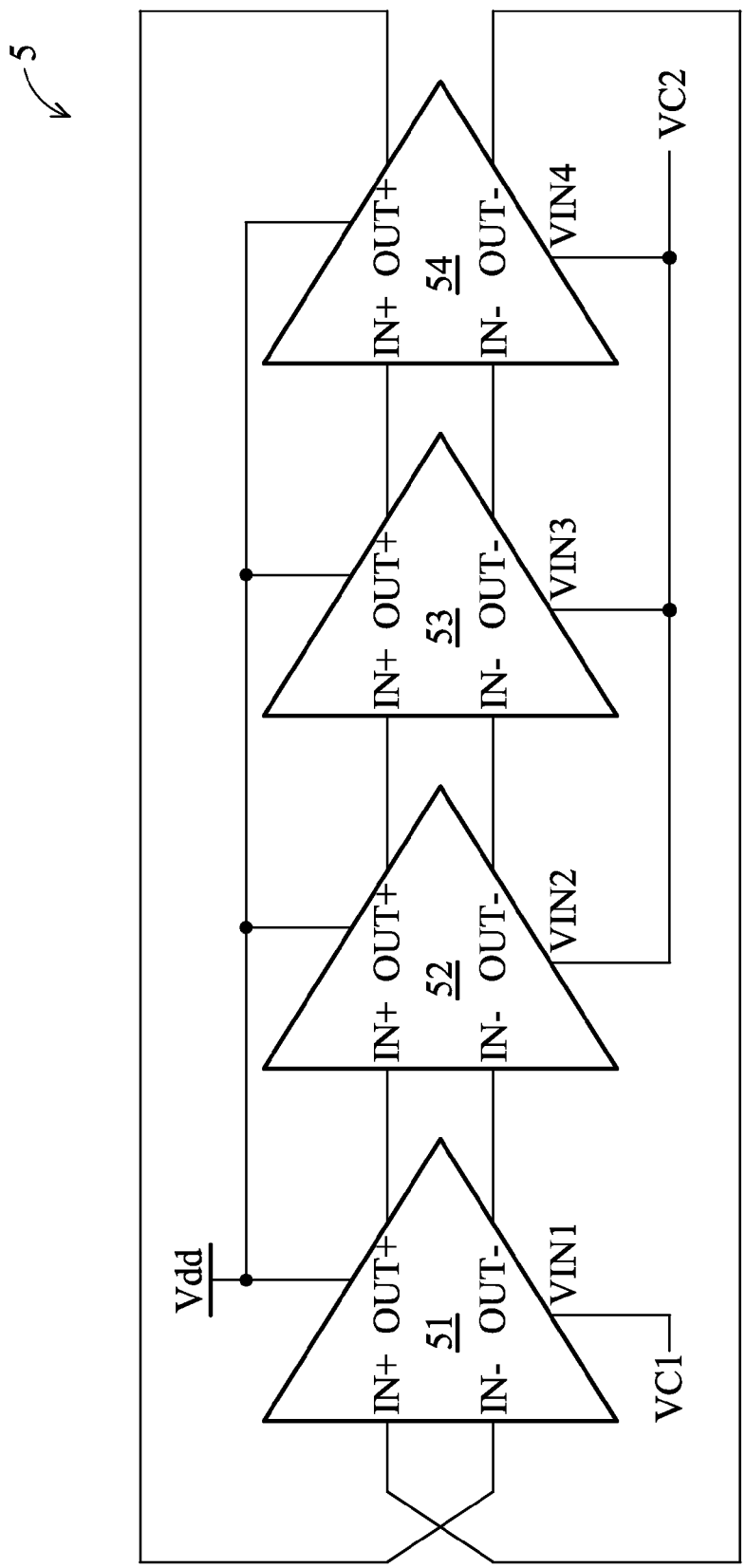
FIG. 5 shows an exemplary embodiment of a voltage controlled oscillator.

The voltage controlled oscillator 3 of FIG. 3 may comprise three or more differential delay cells. In the following description, a voltage controlled oscillator with four differential delay cells (n=4) is given as an example. Referring to FIG. 5, a voltage controlled oscillator 5 comprises four differential delay cells 51-54, that is, the voltage controlled oscillator 5 is a 4-stage voltage controlled oscillator. The differential delay cells 51-54 are serially coupled in a loop. Each of the differential delay cells 51-54 has a control voltage input terminal. A control voltage input terminal VIN1 of the differential delay cell 51 is disconnected from control voltage input terminals VIN2-VIN4 of the differential delay cells 52-54. The control voltage input terminal VIN1 receives a voltage signal VC1 with an adjustable level. Each of the control voltage input terminals VIN2-VIN4 receive a voltage signal VC2 with a fixed level. Thus, the delay time of the differential delay cell 51 is adjustable, and the delay time of the differential delay cells 52-54 are fixed.

Figure 6:
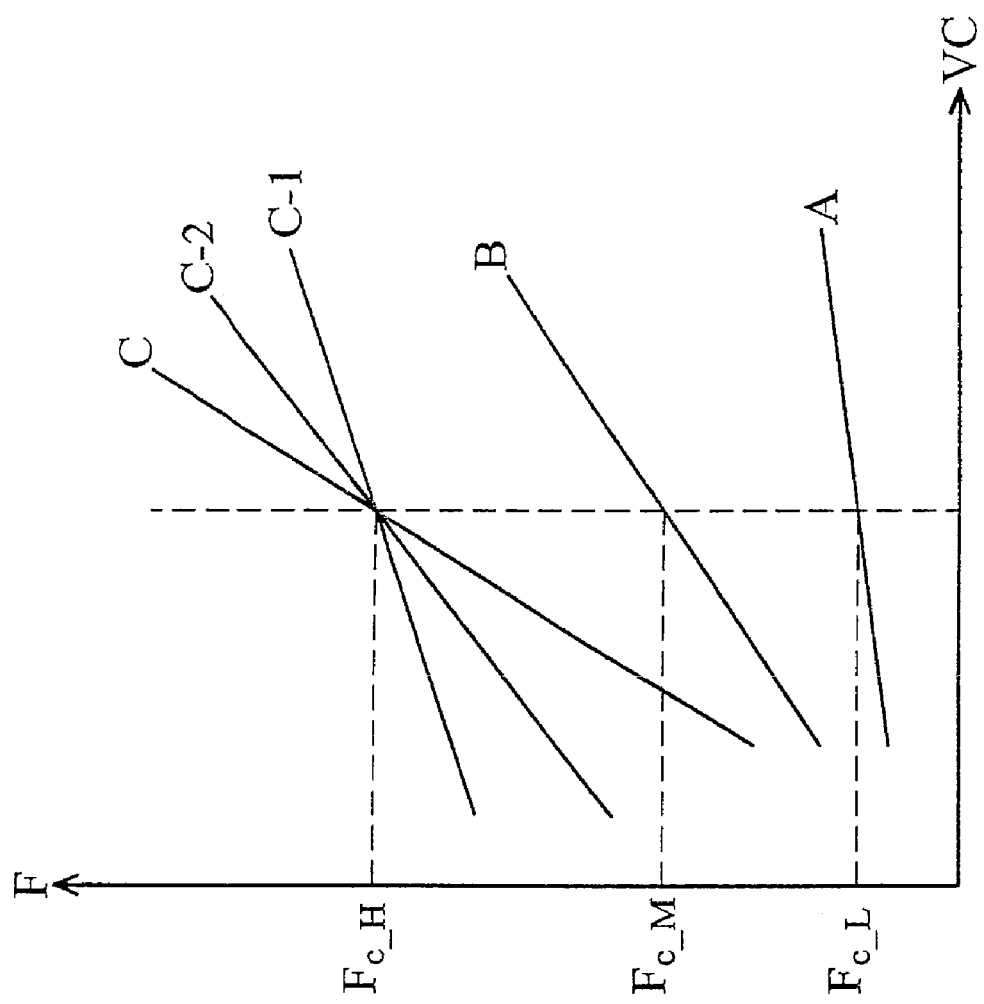
FIG. 6 shows voltage-to-frequency transfer curves of voltage control ring oscillators in FIGS. 5 and 7.

According to the embodiment of FIG. 5, in the 4-stage voltage controlled oscillator 5, only one differential delay cell 51 (m=1) is controlled by a voltage signal with an adjustable level. The ratio of the adjustable delay time to the total delay time becomes less for the 4-stage voltage controlled oscillator 5. Thus, the range of the adjustable frequency becomes less, so that the gain (Kvco) of the voltage controlled oscillator 5 is decreased, and the center frequency thereof is not changed. In the embodiment of FIG. 5, because n=4 and m=1, compared with the Kvco of the transfer curve C, the Kvco of the voltage controlled oscillator 5 is decreased to one fourth of the Kvco of the transfer curve C, as shown by the transfer curve C-1 in FIG. 6.

Figure 7:
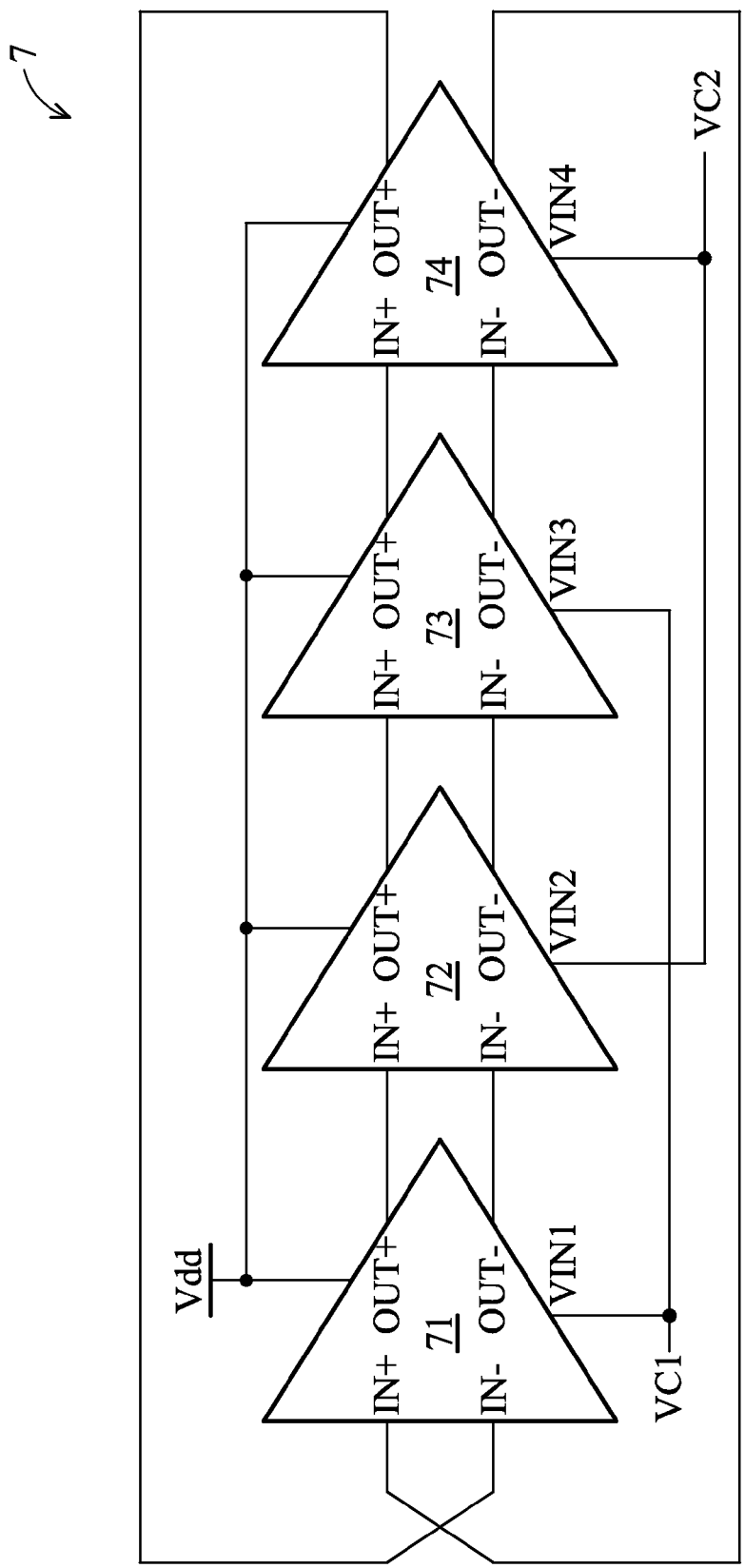
FIG. 7 shows an exemplary embodiment of a voltage controlled oscillator.

In some embodiments, the voltage controlled oscillator 3 of FIG. 3 may comprise two differential delay cells whose delay time is adjustable and at least one differential delay cell whose delay time is fixed. In the following description, a voltage controlled oscillator with two differential delay cells whose delay time is fixed among four differential delay cells (n=4) is given as an example. Referring to FIG. 7, a voltage controlled oscillator 7 comprises four differential delay cells 71-74, that is, the voltage controlled oscillator 7 is a 4-stage voltage controlled oscillator. The differential delay cells 71-74 are serially coupled in a loop. In the embodiment of FIG. 7, each of the differential delay cells 71-74 has a control voltage input terminal. Control voltage input terminals VIN1 and VIN3 of the differential delay cells 71 and 73 receive a voltage signal VC1 with an adjustable level. Control voltage input terminals VIN2 and VIN4 of the differential delay cells 72 and 74 receive a voltage signal VC2 with a fixed level. Thus, the delay time of the differential delay cells 71 and 73 is adjustable, and the delay time of the differential delay cells 72 and 74 are fixed.

According to the embodiment of FIG. 7, in the 4-stage voltage controlled oscillator 7, two differential delay cells 71 and 73 (m=2) are controlled by voltage signals with adjustable levels. Because n=4 and m=2, compared with the Kvco of the transfer curve C, the Kvco of the voltage controlled oscillator 7 is decreased to half (2/4=½) of the Kvco of the transfer curve C, as shown by the transfer curve C-2 in FIG. 6.

In the embodiments, the voltage controlled oscillator 7 can provide balance I/Q phases from the outputs terminals of the differential delay cells 71 and 73. According to the embodiment of FIG. 7, in an n-stage voltage controlled oscillator (n>2, and n is an even number), when differential delay cells with adjusted delay time and differential delay cells with fixed delay time are alternately coupled, the n-stage voltage controlled oscillator can provide balance I/Q phases.

In some embodiments, the differential delay cells 72 and 74 may not have control voltage input terminals to receive a voltage signal with a fixed level, so that the differential delay cells 72 and 74 are not controlled by a voltage signal, and the delay time of the differential delay cells 72 and 74 is also fixed.

Figure 8:
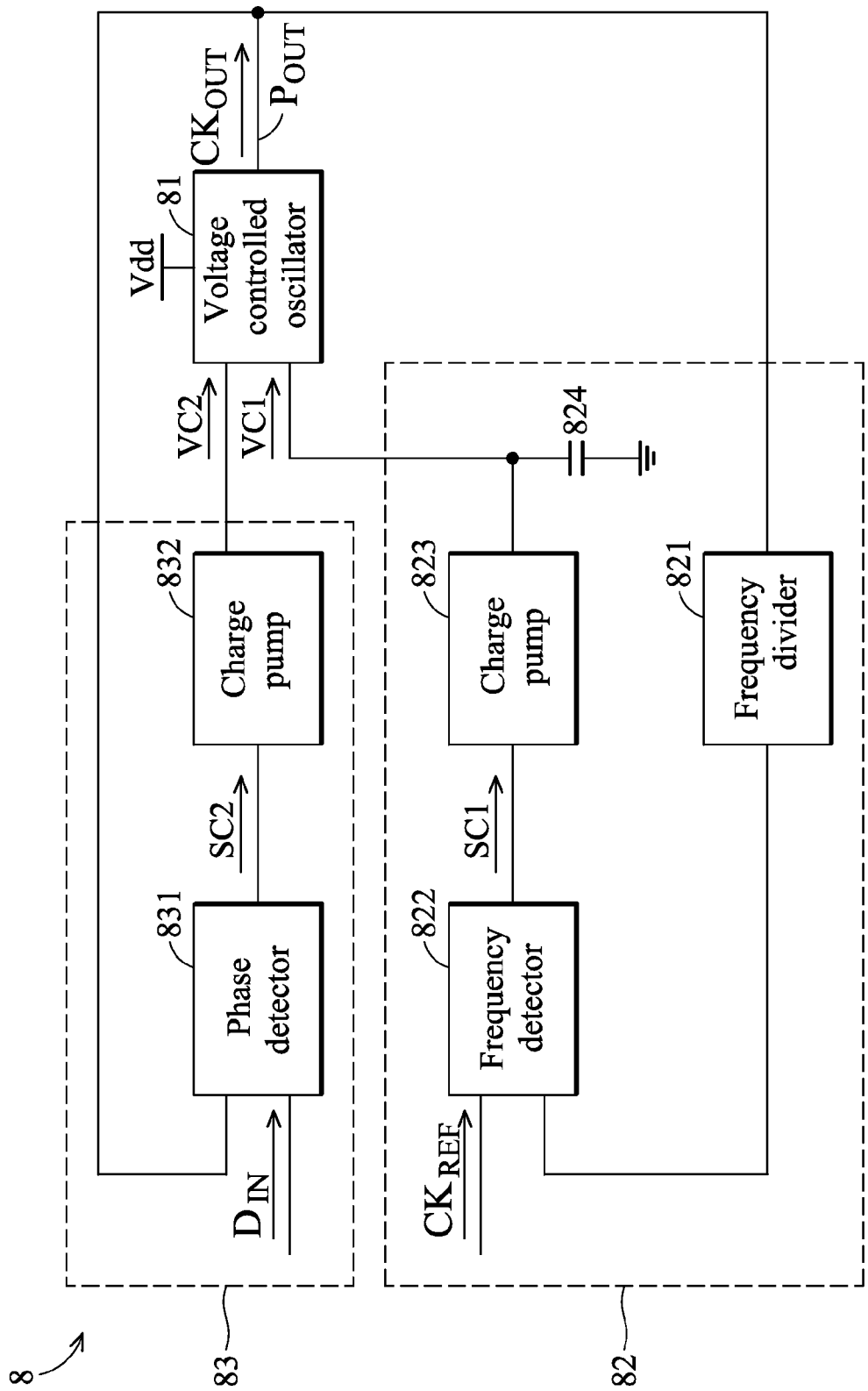
FIG. 8 shows an exemplary embodiment of a phase-frequency locked loop circuit.

The above voltage controlled oscillator comprising two differential delay cells whose delay time is adjustable can be applied in a phase-frequency locked loop circuit. Referring to FIG. 8, a phase-frequency locked loop circuit 8 comprises a voltage controlled oscillator 81, a frequency locked circuit 82, and a phase locked circuit 83. The voltage controlled oscillator 81 is controlled by a voltage signal VC1 and a VC2. The voltage controlled oscillator 81 generates an output clock $CK_{OUT}$ at an output terminal $P_{OUT}$ according to the voltage signals VC1 and VC2. The frequency locked circuit 82 receives a reference clock $CK_{REF}$ and the output clock $CK_{OUT}$ and adjusts the voltage signal VC1 according to the reference clock $CK_{REF}$ and the output clock $CK_{OUT}$. The phase locked circuit 83 receives a data input signal $D_{IN}$ and the output clock $CK_{OUT}$ and adjusts the voltage signal VC2 according to the data input signal $D_{IN}$ and the output clock $CK_{OUT}$.

Figure 9:
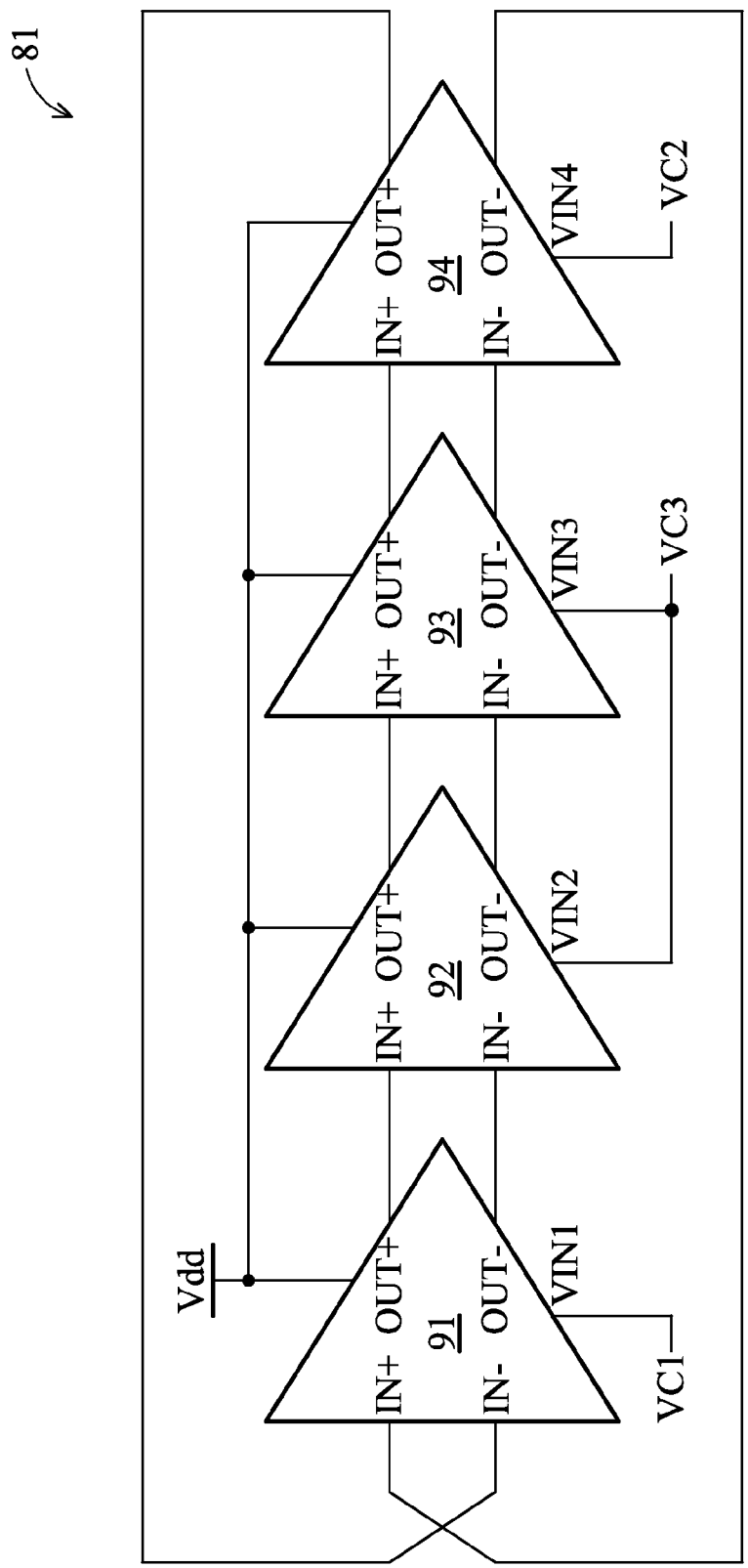
FIG. 9 shows a voltage controlled oscillator in the phase-frequency locked loop circuit of FIG. 8.

Referring to FIG. 9, the voltage controlled oscillator 81 comprises n differential delay cells. In FIG. 9, the voltage controlled oscillator 81 comprises four differential delay cells 91-94, that is, the voltage controlled oscillator 81 is a 4-stage voltage controlled oscillator. The differential delay cells 91-94 are serially coupled in a loop. Each of differential delay cells 91-94 has a control voltage input terminal. A control voltage input terminal VIN1 of the differential delay cell 91 receives a voltage signal VC1 with an adjustable level. A control voltage input terminal VIN4 of the differential delay cell 94 receives a voltage signal VC2 with an adjustable level. Control voltage input terminals VIN2 and VIN3 of the differential delay cells 92 and 93 receive a voltage signal VC3 with a fixed level. Thus, the delay time of the differential delay cells 91 and 94 is adjustable, and the delay time of the differential delay cells 92 and 93 are fixed.

In the voltage controlled oscillator 81, the output terminals of the differential delay cell 94 correspond to the output terminal $P_{OUT}$, and the input terminals of the differential delay cell 91 correspond to the output terminal $P_{OUT}$. In other words, the differential delay cell 94 is the last stage to the output terminal $P_{OUT}$, while the differential delay cell 91 is the next stage to the output terminal $P_{OUT}$.

Referring to FIG. 8, the frequency locked circuit 82 comprises a frequency divider 821, a frequency detector 822, a charge pump 823, and a capacitor 824. The frequency divider 821 divides the frequency of the output clock $CK_{OUT}$. The frequency detector 822 receives the reference clock $CK_{REF}$ and the divided output clock $CK_{OUT}$ and generates a indication signal SC1 according to the difference between the reference clock $CK_{REF}$ and the divided output clock $CK_{OUT}$. The charge pump 823 receives the indication signal SC1 and adjusts the level of the voltage signal VC1 of the differential delay cell 91 according to the indication signal SC1. The capacitor 824 is coupled to the charging pump 823 and stores the adjusted level of the voltage signal VC1.

Referring to FIG. 8, the phase locked circuit 83 comprises a phase detector 831 and a charge pump 832. The phase detector 831 receives the data input signal $D_{IN}$ and the output clock $CK_{OUT}$ and generates a indication signal SC2 according to the difference between the data input signal $D_{IN}$ and the output clock $CK_{OUT}$. The charge pump 832 receives the indication signal SC2 and adjusts the level of the voltage signal VC2 of the differential delay cell 94 according to the indication signal SC2.

As described above, because the frequency loop requires a longer path for slow response, the voltage signal VC1 of the next stage differential delay cell 91 to the output terminal $P_{OUT}$ is adjusted for frequency locking. Moreover, because the phase loop requires a shorter path for fast response, the voltage signal VC2 of the last stage differential delay cell 94 to the output terminal $P_{OUT}$ is adjusted for phase locking.

Figure 10:
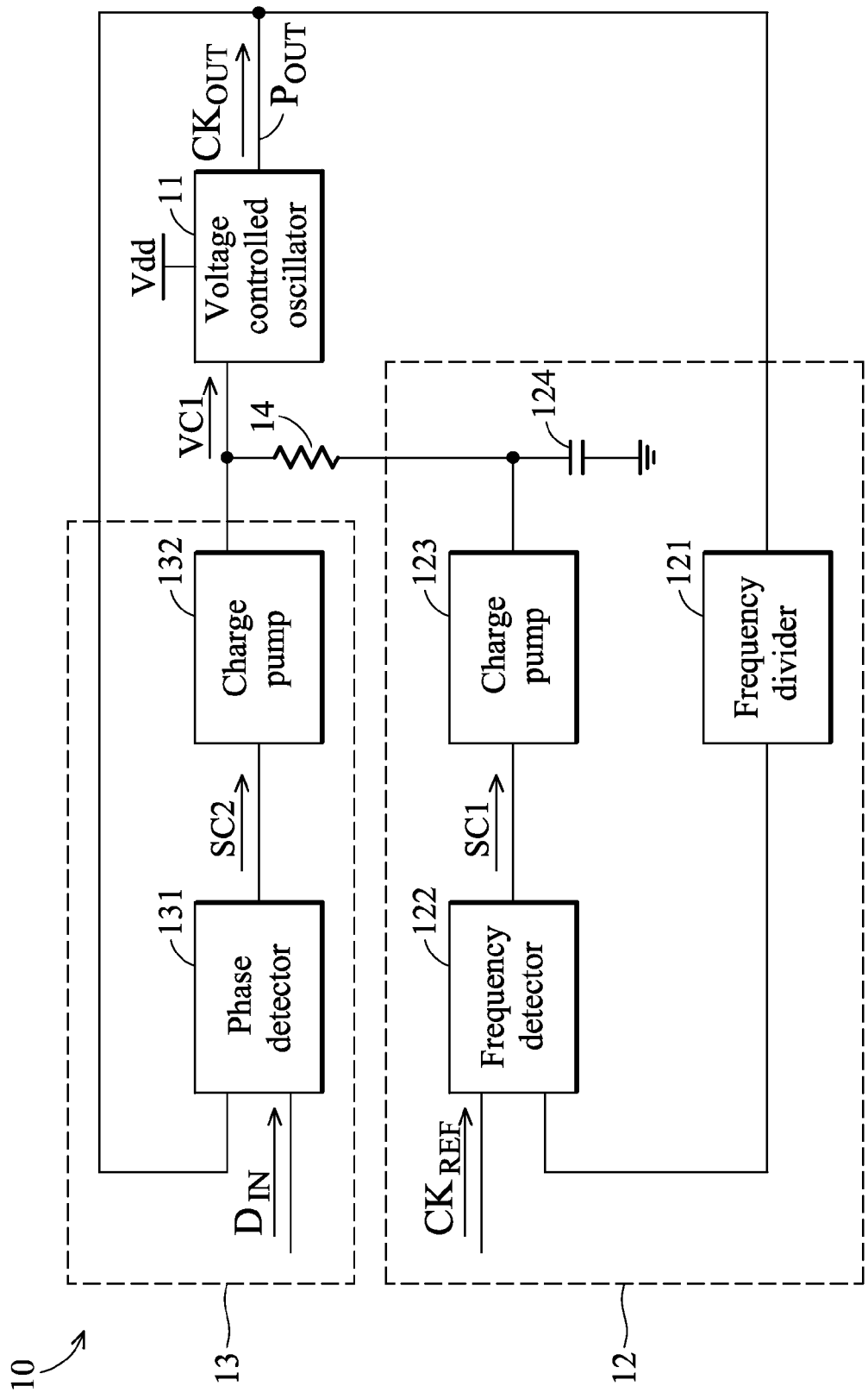
FIG. 10 shows another exemplary embodiment of a phase-frequency locked loop circuit.
Figure 11:
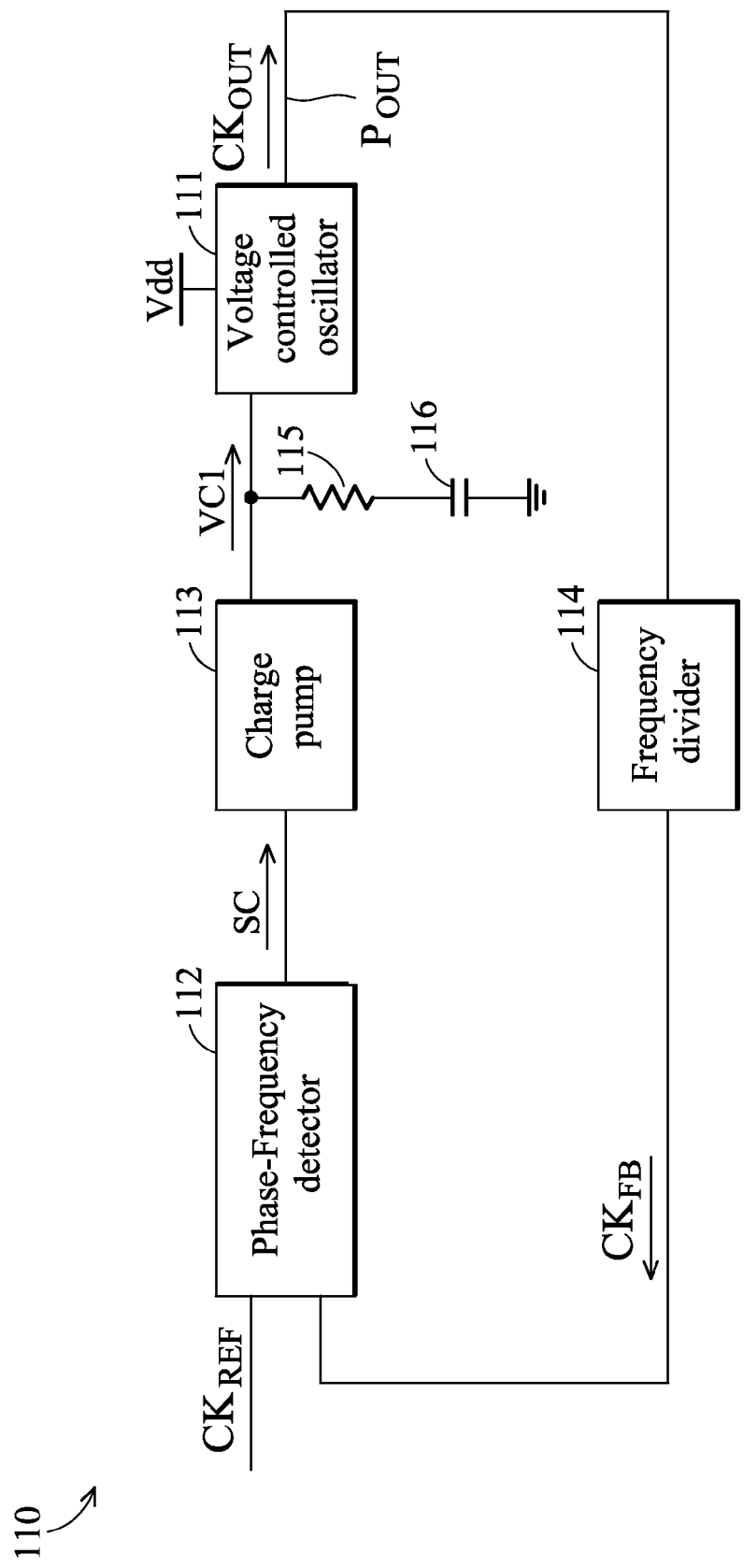
FIG. 11 shows another exemplary embodiment of a phase-frequency locked loop circuit.

The above voltage controlled oscillator comprising one differential delay cell whose delay time is adjustable and another differential delay cell whose delay time is fixed can be applied in a phase-frequency locked loop circuit as shown in FIGS. 10 and 11. Referring to FIG. 10, a phase-frequency locked loop circuit 10 with two loops comprises a voltage controlled oscillator 11, a frequency locked circuit 12, and a phase locked circuit 13. The frequency locked circuit 12 may comprise a frequency divider 121, a frequency detector 122, a charge pump 123, and a capacitor 124. The frequency locked circuit 12 performs similar operations to those of the frequency locked circuit 82 in FIG. 8 and generates a voltage signal. The phase locked circuit 13 comprises a phase detector 131 and a charge pump 132. The phase locked circuit 13 performs similar operations to those of the phase locked circuit 83 in FIG. 8 and generates a voltage signal VC1. The voltage signal generated by the frequency locked circuit 12 couples to the voltage signal VC1 through a resistor 14, and the coupled voltage signal VC1 is provided to control the voltage controlled oscillator 11.

In some embodiments, the voltage controlled oscillator 11 may comprises the differential delay cells 31 and 32, as shown in FIG. 3, wherein the output terminals of the differential delay cell 32 correspond to a output terminal $P_{OUT}$ of the voltage controlled oscillator 11. The voltage signal VC1 is used to control the differential delay cell 31 through the control voltage input terminal VIN1. The voltage signal VC1 has an adjustable level, so that the delay time of the differential delay cell 31 is adjustable. The differential delay cell 32 receives a voltage signal VC2 with a fixed level through the control voltage input terminal VIN2, and the delay time of the differential delay cell 32 is fixed.

Figure 4:
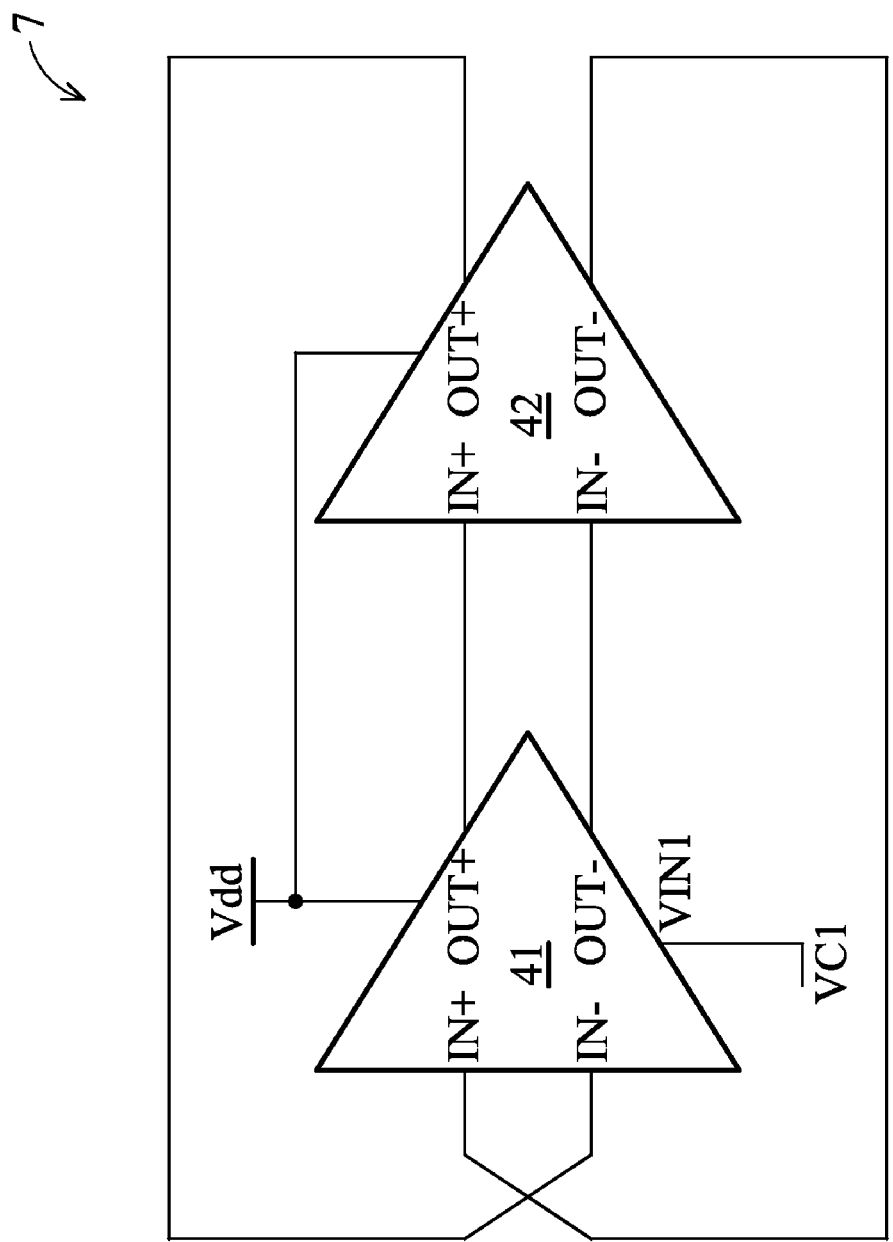
FIG. 4 shows an exemplary embodiment of a voltage controlled oscillator.

In other some embodiments, the voltage controlled oscillator 11 may comprises the differential delay cells 41 and 42, as shown in FIG. 4, wherein the output terminals of the differential delay cell 42 correspond to an output terminal $P_{OUT}$ of the voltage controlled oscillator 11. The voltage signal VC1 is used to control the differential delay cell 41. The voltage signal VC1 has an adjustable level, so that the delay time of the differential delay cell 41 is adjustable. The differential delay cell 42 does not have a control voltage input terminal for receiving a voltage signal, and the delay time of the differential delay cell 42 is fixed.

Referring to FIG. 11, a phase-frequency locked loop circuit 110 with single loop comprises a voltage controlled oscillator 111, a phase-frequency detector 112, a charge pump 113, and a frequency divider 114. The phase-frequency detector 112 receives a reference clock $CK_{REF}$ and a feedback clock $CK_{FB}$ and generates an indication signal SC according to the difference between the reference clock $CK_{REF}$ and the feedback clock $CK_{FB}$. The charge pump 113 receives the indication signal SC and generates a voltage signal VC1. The charge pump 113 adjusts a level of the voltage signal VC1 according to the indication signal SC. The voltage controlled oscillator 111 is controlled by the voltage signal VC1 and generates an output clock $CK_{OUT}$ at an output terminal $P_{OUT}$. The frequency divider 114 divides the frequency of the output clock $CK_{OUT}$ to serve as the feedback $CK_{FB}$ for the phase-frequency detector 112. The phase-frequency locked loop circuit 110 may further comprises a resistor 115 and a capacitor 116. One terminal of the resistor 115 is coupled between the charge pump 113 and the voltage controlled oscillator 111. The resistor is coupled between the other terminal of the resistor 115 and a ground. The resistor 115 and the capacitor 116 compose a low-pass filter.

In some embodiments, the voltage controlled oscillator 111 may comprises the differential delay cells 31 and 32, as shown in FIG. 3, wherein the output terminals of the differential delay cell 32 correspond to the output terminal $P_{OUT}$. The voltage signal VC1 is used to control the differential delay cell 31 through the control voltage input terminal VIN1. The voltage signal VC1 has an adjustable level, so that the delay time of the differential delay cell 31 is adjustable. The differential delay cell 32 receiving a voltage signal VC2 with a fixed level through the control voltage input terminal VIN2, and the delay time of the differential delay cell 32 is fixed.

In other some embodiments, the voltage controlled oscillator 111 may comprises the differential delay cells 41 and 42, as shown in FIG. 4, wherein the output terminals of the differential delay cell 42 correspond to the output terminal $P_{OUT}$. The voltage signal VC1 is used to control the differential delay cell 41. The voltage signal VC1 has an adjustable level, so that the delay time of the differential delay cell 41 is adjustable. The differential delay cell 42 does not have a control voltage input terminal for receiving a voltage signal, and the delay time of the differential delay cell 42 is fixed.

According to the embodiments, the voltage controlled oscillators provide a high center frequency and a small gain (Kvco). Moreover, the voltage controlled oscillators can be applied in a phase-frequency locked loop circuit. Through two differential delay cells with adjustable delay times, the frequency locked circuit and the phase locked circuit respectively operate.

In above embodiments, the connections between n differential delay cells in an n-stage voltage controlled oscillator are given as an example. According to different applications, n differential delay cells in an n-stage voltage controlled oscillator can be coupled serially in a loop by other types of connection.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A voltage controlled oscillator comprising:
    a first differential delay cell powered by a first supply voltage and having a first control voltage input terminal; and
    a second differential delay cell powered by a second supply voltage, coupled to the first differential delay cell in a loop, and having a second control voltage input terminal which is disconnected from the first control voltage input terminal;
    wherein the first control voltage input terminal receives a first voltage signal, and the second control voltage input terminal receives a second voltage signal different from the first voltage signal, wherein each of the first and second voltage signals is at an adjustable level;
    at least one differential delay cell coupled between the first and second differential delay cells and having a third control voltage input terminal receiving a third voltage signal with a fixed level.

2. The voltage controlled oscillator as claimed in claim 1 further comprising at least one differential delay cell coupled between the first and second differential delay cells, wherein the delay time of the least one differential delay cell is fixed.

3. A voltage controlled oscillator comprising:
    a first differential delay cell powered by a first supply voltage and having a first control voltage input terminal; and
    a second differential delay cell powered by a second supply voltage, coupled to the first differential delay cell in a loop, and having a second control voltage input terminal which is disconnected from the first control voltage input terminal;
    wherein the first control voltage input terminal receives a first voltage signal with an adjustable level, and the second control voltage input terminal receives a second voltage signal with a fixed level.

4. A voltage controlled oscillator comprising:
    a first differential delay cell powered by a first supply voltage and having a control voltage input terminal; and
    a second differential delay cell powered by a second supply voltage and coupled to the first differential delay cell in a loop;
    wherein the control voltage input terminal receives a voltage signal with an adjustable level, the delay time of the second differential delay cell is fixed.

5. A phase-frequency locked loop circuit comprising:
    a voltage controlled oscillator controlled by a first voltage signal and a second voltage signal and generating an output clock at an output terminal according to the first and second voltage signals;
    a frequency locked circuit receiving a reference clock and the output clock and adjusting the first voltage signal according to the reference clock and the output clock; and
    a phase locked circuit receiving a data input signal and the output clock and adjusting the second voltage signal according to the data input signal and the output clock,
    wherein the voltage controlled oscillator comprises:
        n differential delay cells coupled serially in a loop to generate the outlook clock at the output terminal, $n \geq 2$, and each of the differential delay cells is powered by at least one supply voltage;
        wherein the n-th differential delay cell is the last stage to the output terminal and has a first control voltage input terminal receiving the first voltage signal;
        wherein the first differential delay cell is the next stage to the output terminal and has a second control voltage input terminal receiving the second voltage signal different from the first voltage signal.

6. The phase-frequency locked loop circuit as claimed in claim 5, wherein the frequency locked circuit comprises:
    a frequency divider dividing the frequency of the output clock;
    a frequency detector receiving the reference clock and the divided output clock and generating a first indication signal according to the difference between the reference clock and the divided output clock; and a first charge pump receiving the first indication signal and adjusting the level of the first voltage signal according to the first indication signal.

7. The phase-frequency locked loop circuit as claimed in claim 6, wherein the frequency locked circuit further comprises a capacitor coupled to the first charging pump and storing the adjusted level of the first voltage signal.

8. The phase-frequency locked loop circuit as claimed in claim 5, wherein the phase locked circuit comprises:
 a phase detector receiving the data input signal and the output clock and generating a second indication signal according to the difference between the data input signal and the output clock; and
 a second charge pump receiving the second indication signal and adjusting the level of the second voltage signal according to the second indication signal.

9. The phase-frequency locked loop circuit as claimed in claim 5, wherein when n≧3, each of the second to (n−1)th differential delay cells has a third control voltage input terminal receiving a third voltage signal with a fixed level.

10. The phase-frequency locked loop circuit as claimed in claim 5, wherein when n≧3, the delay of the second to (n−1)th differential delay cell is fixed.

11. A phase-frequency locked loop circuit comprising:
 a phase-frequency detector receiving a reference clock and a feedback clock and generating an indication signal according to the difference between the reference clock and the feedback clock;
 a charge pump receiving the indication signal, generating a first voltage signal, and adjusting a level of the first voltage signal according to the indication signal;
 a voltage controlled oscillator controlled by the first voltage signal and generating an output clock at an output terminal, wherein the voltage controlled oscillator comprises:
 a first differential delay cell having a first control voltage input terminal for receiving the first voltage signal, wherein the delay time of the first differential delay cell is determined by the adjusted level of the first voltage signal; and
 a second differential delay cell coupled to the first differential delay cell in a loop, wherein the delay time of the second differential delay cell is fixed; and
 a frequency divider dividing the frequency of the output clock to serve as the feedback for the phase-frequency detector;
 wherein each of the first and second differential delay cells is powered by at least one supply voltage.

12. The phase-frequency locked loop circuit as claimed in claim 11, further comprises:
 a resistor having a first terminal coupled between the charge pump and the voltage controlled oscillator and a second terminal; and
 a capacitor coupled between the second terminal of the resistor and a ground.

13. The phase-frequency locked loop circuit as claimed in claim 11, wherein the second differential delay cell has a second control voltage input terminal receiving a second voltage signal with a fixed level.

14. A voltage controlled oscillator comprising:
 a first differential delay cell powered by a first supply voltage and having a first control voltage input terminal; and
 a second differential delay cell powered by a second supply voltage, coupled to the first differential delay cell in a loop, and having a second control voltage input terminal which is disconnected from the first control voltage input terminal;
 wherein the first control voltage input terminal receives a first voltage signal for controlling delay time of the first differential delay cell, and the second control voltage input terminal receives a second voltage signal different from the first voltage signal for controlling delay time of the second differential delay cell.

\* \* \* \* \*